United States Patent
Yu et al.

(10) Patent No.: US 7,781,143 B2
(45) Date of Patent: Aug. 24, 2010

(54) NEGATIVE-WORKING IMAGEABLE ELEMENTS AND METHODS OF USE

(75) Inventors: Jianfei Yu, Fort Collins, CO (US); Kevin B. Ray, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 327 days.

(21) Appl. No.: 11/756,036

(22) Filed: May 31, 2007

(65) Prior Publication Data

US 2008/0299488 A1    Dec. 4, 2008

(51) Int. Cl.
*G03F 7/004* (2006.01)
*B41M 5/00* (2006.01)

(52) U.S. Cl. .............. 430/270.1; 430/271.1; 430/281.1; 430/302; 430/920; 430/926; 430/944; 101/465; 101/467

(58) Field of Classification Search .............. 430/270.1, 430/271.1, 302, 944, 281.1, 920, 926; 101/465, 101/467
See application file for complete search history.

(56) References Cited

U.S. PATENT DOCUMENTS

| | | | |
|---|---|---|---|
| 6,720,125 B2 * | 4/2004 | Nakamura et al. | 430/157 |
| 6,727,044 B1 | 4/2004 | Fujimaki et al. | |
| 6,794,104 B2 | 9/2004 | Tashiro | |
| 6,797,449 B2 * | 9/2004 | Nakamura et al. | 430/160 |
| 6,899,994 B2 | 5/2005 | Huang et al. | |
| 6,916,595 B2 | 7/2005 | Fujimaki et al. | |
| 7,135,271 B2 | 11/2006 | Kawauchi et al. | |
| 7,575,844 B2 * | 8/2009 | Kasperchik et al. | 430/138 |
| 2004/0131972 A1 | 7/2004 | Fujimaki | |
| 2005/0031986 A1 | 2/2005 | Kakino et al. | |
| 2005/0186504 A1 | 8/2005 | Matsumoto | |
| 2006/0068328 A1 | 3/2006 | Arimura et al. | |
| 2006/0199097 A1 | 9/2006 | Oda et al. | |

FOREIGN PATENT DOCUMENTS

| | | |
|---|---|---|
| EP | 1 262 828 A1 | 12/2002 |
| EP | 1 296 187 A2 | 3/2003 |
| EP | 1 298 490 A2 | 4/2003 |
| EP | 1 674 928 A2 | 6/2006 |
| WO | 2007/139687 A1 | 12/2007 |

OTHER PUBLICATIONS

U.S. Appl. No. 11/441,601, filed May 26, 2006, titled Negative-Working Radiation-Sensitive Compositions and Imageable Materials, by Ting Tao et al.
U.S. Appl. No. 11/475,694, filed Jun. 27, 2006, titled Negative-Working Radiation-Sensitive Compositions and Imageable Elements, by Heidi Munnelly et al.
U.S. Appl. No. 11/532,647, filed Sep. 18, 2006, titled Negative-Working Radiation-Sensitive Compositions and Imageable Materials, by Jianfei Yu et al.
U.S. Appl. No. 11/734,796, filed Apr. 13, 2007, titled Negative-Working Imageable Elements and Methods of Use, by Jianfei Yu et al.
XP-002496550—JP Abstract 2000-581635 (Mitsubishi Chem Corp).
F.Castellanos et al., "Synthesis, reativity and properties of new diaryliodonium salts as photoinitiators for the cationic polymerization of epoxy silicones", *J.App. Pol. Sci.*, vol. 60, No. 5, (1996), pp. 705-713.

* cited by examiner

*Primary Examiner*—John S Chu
(74) *Attorney, Agent, or Firm*—J. Lanny Tucker

(57) ABSTRACT

Negative-working imageable elements that can be imaged using infrared radiation comprise an imageable layer and a protective overcoat on a hydrophilic substrate. The imageable layer includes an IR-sensitive cyanine dye. The protective overcoat predominantly comprises one or more poly(vinyl alcohol) resins, each of which has a hydrolysis level of 85% or less. The use of this particular overcoat composition used in combination with the IR-sensitive cyanine dye provides improved tolerance to fogging by white light while maintaining desired imaging speed.

18 Claims, No Drawings

NEGATIVE-WORKING IMAGEABLE ELEMENTS AND METHODS OF USE

FIELD OF THE INVENTION

This invention relates to imageable elements such as negative-working lithographic printing plate precursors that have improved tolerance to white light. The invention also relates to methods of using these imageable elements.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various radiation compositions and imageable elements are described in U.S. Pat. Nos. 6,309,792 (Hauck et al.), 6,893,797 (Munnelly et al.), 6,787,281 (Tao et al.), and 6,899,994 (Huang et al.), U.S. Patent Application Publication 2003/0118939 (West et al.), and EP 1,079,276A1 (Lifka et al.) and EP 1,449,650A1 (Goto).

Other negative-working imageable elements are described, for example, in U.S. Pat. Nos. 6,916,595 (Fujimaki et al.), 6,702,437 (Fujimaki et al.), and 6,727,044 (Fujimaki et al.), Japanese Kokai 2000-187322 (Mitsubishi Chemical Co.), and U.S. Patent Application Publications 2004/0131972 (Fujimaki et al.), 2005/0031986 (Kakino et al.), 2006/0068328 (Aimura et al), and 2006/0199097 (Oda et al.).

Negative-working imageable elements have also been designed with overcoat layers that provide lower barriers to oxygen permeation as described, for example in EP 1,296,187A2 (Oshima). Such overcoat layers apparently include polymers that are more permeable to oxygen than poly(vinyl alcohol).

PROBLEM TO BE SOLVED

The various negative-working compositions and elements described in the art have many desired properties including resistance to chemical solutions used in development and printing, run length, shelf stability, and imaging sensitivity. Some of these elements are designed with a protective overcoat or oxygen barrier disposed over the negative-working imageable layer.

However, there is a need to improve the resistance that such elements have to fogging when exposed to ambient room light ("white light"). Fogging is usually observed as an ink-receptive "stain" over the surface of the element because imageable layer coating resists development and remains when it is not wanted. While some earlier elements were thought to have sufficient resistance to fogging under ambient lighting, the exposure conditions in large manufacturing facilities are hard to control and it would be desirable to eliminate this potential problem as a concern.

SUMMARY OF THE INVENTION

The present invention provides an imageable element comprising a substrate having thereon an imageable layer comprising:

a free radically polymerizable component, an initiator composition capable of generating free radicals sufficient to initiate polymerization of free radically polymerizable groups upon exposure to imaging radiation, the initiator composition comprising a diaryliodonium borate, an infrared radiation absorbing cyanine dye having a methine chain connecting heterocyclic groups wherein the methine chain is at least 7 carbon atoms in length, and a primary polymeric binder, and the imageable element further comprising an overcoat disposed over the imageable layer, the overcoat predominantly comprising a poly(vinyl alcohol) that has a hydrolysis level equal to or less than 85%.

In some embodiments of the imageable element, the substrate is an electrochemically grained, sulfuric acid anodized, poly(vinyl phosphonic acid) coated lithographic aluminum substrate, the free radically polymerizable component comprises a free radically polymerizable monomer or oligomer, the initiator composition comprises a diaryliodonium borate that is present in an amount of from about 0.5 to about 30 weight % based on the total dry weight of the imageable layer and is represented by the following Structure (IB):

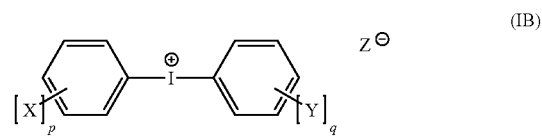

wherein X and Y are independently halo, alkyl, alkoxy, aryl, or cycloalkyl groups, or two or more adjacent X or Y groups can be combined to form a fused carbocyclic or heterocyclic ring with the respective phenyl groups, provided that the sum of the carbon atoms in the X and Y substituents or fused ring(s) is at least 6, either p or q is at least 1, and $Z^{\ominus}$ is an organic anion represented by the following Structure ($IB_Z$):

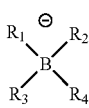

wherein $R_1$, $R_2$, $R_3$, and $R_4$ are independently alkyl, aryl, alkenyl, alkynyl, cycloalkyl, or heterocyclyl groups, provided that at least 3 of $R_1$, $R_2$, $R_3$, and $R_4$ are the same or different substituted or unsubstituted aryl groups, the infrared radiation absorbing cyanine dye is present in an amount of from about 1 to about 30 weight % based on the total dry weight of the imageable layer and is represented by the following Structure (DYE-I):

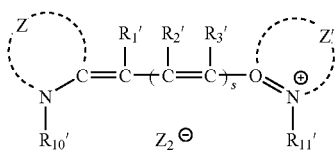

wherein $R_1'$, $R_2'$, and $R_3'$ are independently hydrogen or halo, cyano, alkoxy, acyloxy, aryloxy, carbamoyl, acyl, acylamido, alkylamino, aryl, alkyl, cycloalkyl, arylamino, heteroaryl, thiobenzene, piperazino, morpholino, or thiotetrazole groups, or any two of $R_1'$, $R_2'$, and $R_3'$ can be joined together or with an adjacent heterocyclic ring to complete a 5- to 7-membered carbocyclic or heterocyclic ring, Z and Z' independently represent the carbon, nitrogen, oxygen, or sulfur atoms necessary to form a 5- to 14-membered heterocyclic ring with the illustrated nitrogen atoms, $R_{10}'$ and $R_{11}'$ are independently alkyl, cycloalkyl, or aryl groups, s is at least 3, and $Z_2^{\ominus}$ is a monovalent anion, and the primary polymeric binder comprises particles of a poly (urethane-acrylic) hybrid that are present in an amount of from about 10 to about 90 weight % based on the total dry weight of said imageable layer, and and further comprising a secondary polymeric binder that is present in an amount of from about 1.5 to about 70 weight % based on the total dry weight of the imageable layer and comprises one or more polymers comprising recurring units having carboxy groups or derived from one or more (meth) acrylates, (meth)acrylamides, N-substituted (meth)acrylamides, styrene or styrene derivatives, vinyl acetal, N-substituted cyclic imides, maleic anhydride, vinyl carbazole, divinyl monomers, (meth)acrylonitriles, poly(alkylene glycols), or poly(alkylene glycol) (meth)acrylates, and the overcoat predominantly comprises one or more poly (vinyl alcohol)s each of which has a hydrolysis level of from about 75 and up to and equal to 85%.

This invention also provides a method comprising:

A) imagewise exposing the imageable element of this invention using imaging infrared radiation to produce exposed and non-exposed regions, and B) with or without a post-exposure baking step, developing the imagewise exposed element to remove only the non-exposed regions.

In preferred embodiments, this method provides lithographic printing plates with lithographic hydrophilic substrates that accept aqueous fountain solutions and repel ink.

Unexpectedly, it has been found that the negative-working imageable elements of this invention have improved resistance to fogging when exposed for an extended time to ambient lighting conditions (for example, "white light" having a wavelength of 600 nm or less, exposure at 600 lux for at least 2 hours). Moreover, we found a way to provide this solution to the fogging problem without a loss in imaging speed or sensitivity. In addition, the imageable elements also have desired chemical resistance, run length, and shelf life.

These advantages are achieved by using a radiation-sensitive composition in the imageable element that includes a particular infrared radiation-sensitive cyanine dye, and with a specific poly(vinyl alcohol) as the predominant polymeric binder in the overcoat or oxygen barrier layer. The useful cyanine dye has a methine chain with at least 7 carbon atoms connecting two heterocyclic groups. The predominant overcoat polymeric binder in the overcoat is a poly(vinyl alcohol) that has a hydrolysis level of 85% or less. Using the specific IR-sensitive cyanine dye without the unique overcoat polymeric binder will provide suitable imaging speed, but fogging is still a problem. Yet, if the specific overcoat poly(vinyl alcohol) is used without the specific IR-sensitive cyanine dye, fogging is reduced but imaging speed is also reduced. Thus, we have found that the combination of the specific IR-sensitive cyanine dye and the specific overcoat poly(vinyl alcohol) solve the fogging problem without loss in imaging speed. Achieving these results from our use of the combination of components was not expected from our knowledge of known negative-working imageable elements.

DETAILED DESCRIPTION OF THE INVENTION

Definitions

Unless the context indicates otherwise, when used herein, the terms "imageable element", "lithographic printing plate precursor", and "printing plate precursor" are meant to be references to embodiments of the present invention.

In addition, unless the context indicates otherwise, the various components described herein such as "primary polymeric binder", "initiator", "co-initiator", "free radically polymerizable component", "infrared radiation absorbing cyanine dye", "secondary polymeric binder", "nonionic phosphate acrylate", "poly(vinyl alcohol)", and similar terms also refer to mixtures of such components. Thus, the use of the articles "a", "an", and "the" is not necessarily meant to refer to only a single component.

Moreover, unless otherwise indicated, percentages refer to percents by dry weight, for example, weight % based on total solids or dry layer composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Imageable Layers

The imageable elements include an infrared (IR) radiation-sensitive composition disposed on a suitable substrate to form an imageable layer. The imageable elements may have any utility wherever there is a need for an applied coating that is polymerizable using suitable radiation, and particularly where it is desired to remove unexposed regions of the coating instead of exposed regions. The IR radiation-sensitive compositions can be used to prepare an imageable layer in imageable elements such as printed circuit boards for integrated circuits, microoptical devices, color filters, photomasks, and printed forms such as lithographic printing plate precursors that are defined in more detail below.

The IR radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated components that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (noted above), beginning with paragraph [0170], and in U.S. Pat. Nos. 6,309,792 (Hauck et al.), 6,569,603 (Furukawa), and 6,893,797 (Munnelly et al.).

In addition to, or in place of the free radically polymerizable components described above, the IR radiation-sensitive composition may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule, or typically from 2 to 10 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

Useful commercial products that comprise polymers that can be used in this manner include Bayhydrol® UV VP LS 2280, Bayhydrol® UV VP LS 2282, Bayhydrol® UV VP LS 2317, Bayhydrol® UV VP LS 2348, and Bayhydrol® UV XP 2420, that are all available from Bayer MaterialScience, as well as Laromer™ LR 8949, Laromer™ LR 8983, and Laromer™ LR 9005, that are all available from BASF.

The one or more free radically polymerizable components (monomeric, oligomeric, or polymeric) can be present in the imageable layer in an amount of at least 10 weight % and up to 70 weight %, and typically from about 20 to about 50 weight %, based on the total dry weight of the imageable layer. The weight ratio of the free radically polymerizable component to the total polymeric binders (described below) is generally from about 5:95 to about 95:5, and typically from about 10:90 to about 90:10, or even from about 30:70 to about 70:30.

The IR radiation-sensitive composition also includes an initiator composition that is capable of generating free radicals sufficient to initiate polymerization of all the various free radically polymerizable components upon exposure of the composition to imaging radiation. The initiator composition is generally responsive to infrared imaging radiation corresponding to the spectral range of at least 700 nm and up to and including 1400 nm (typically from about 700 to about 1200 nm). Initiator compositions are used that are appropriate for the desired imaging wavelength(s).

Useful initiators include those represented by the following Structure (IB):

$$[X]_p \text{—Ar—} \overset{\oplus}{I} \text{—Ar—} [Y]_q \quad Z^{\ominus} \tag{IB}$$

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

$Z^\ominus$ is an organic anion represented by the following Structure (IB$_Z$):

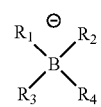

(IB$_Z$)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. $Z^\ominus$ can be a tetraphenyl borate wherein the phenyl groups are substituted or unsubstituted (for example, all are unsubstituted).

Representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Mixtures of two or more of these compounds can also be used in the iodonium borate initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999), both of which are incorporated herein by reference.

The free radical generating compounds in the initiator composition are generally present in the imageable layer in an amount of at least 0.5% and up to and including 30%, and typically at least 2 and up to and including about 20%, based on total dry weight of the imageable layer. The optimum amount of the various initiator components may differ for various compounds and the sensitivity of the radiation-sensitive composition that is desired and would be readily apparent to one skilled in the art.

The free radical generating compounds (initiators) may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2, 4-triazole.

For example, initiator compositions can include the following combinations:

a diaryliodonium borate as described above in combination with a co-initiator that is a metallocene (for example a titanocene or ferrocene) as described for example in U.S. Pat. No. 6,936,384 (noted above), or a diaryliodonium borate as described above in combination with a co-initiator that is a mercaptotriazole as described above.

The radiation-sensitive composition generally includes one or more infrared radiation absorbing cyanine dyes that absorb imaging radiation, or sensitize the composition to imaging radiation having a $\lambda_{max}$ in the IR region of the electromagnetic spectrum noted above.

These cyanine dyes have a methine chain of at least 7 carbon atoms in length (at least heptadiene), which connects two of the same or different heterocyclic groups, and typically nitrogen-containing heterocyclic groups. For example, the same or different heterocyclic rings can include two fused rings in which at least one of the nitrogen atoms in at least one of the heterocyclic groups is a quaternary nitrogen atom.

For example, representative useful IR-sensitive cyanine dyes of this type can be defined by the following Structure (DYE-I):

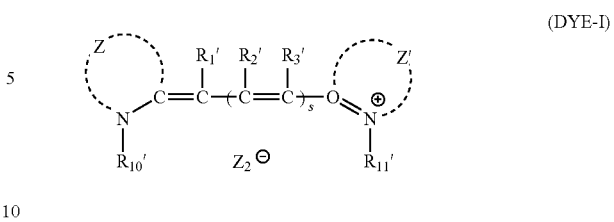

wherein $R_1'$, $R_2'$, and $R_3'$ each independently represents hydrogen, or a halo, cyano, substituted or unsubstituted alkoxy (having 1 to 8 carbon atoms, both linear and branched alkoxy groups), substituted or unsubstituted aryloxy (having 6 to 10 carbon atoms in the carbocyclic ring), substituted or unsubstituted acyloxy (having 2 to 6 carbon atoms), carbamoyl, substituted or unsubstituted acyl, substituted or unsubstituted acylamido, substituted or unsubstituted alkylamino (having at least one carbon atom), substituted or unsubstituted carbocyclic aryl groups (having 6 to 10 carbon atoms in the aromatic ring, such as phenyl and naphthyl groups), substituted or unsubstituted alkyl groups (having 1 to 8 carbon atoms, both linear and branched isomers), substituted or unsubstituted cycloalkyl groups having 5 to 10 carbon atoms in the single or fused ring groups, substituted or unsubstituted arylamino, or substituted or unsubstituted heteroaryl (having at least 5 carbon and heteroatoms in the ring) group. Alternatively, any two of $R_1'$, $R_2'$, and $R_3'$ groups may be joined together or with an adjacent heterocyclic ring to complete the same or different 5- to 7-membered substituted or unsubstituted carbocyclic or heterocyclic ring. In addition, or more of the $R_1'$, $R_2'$, and $R_3'$ groups can also be substituted or unsubstituted thiobenzene, piperazino, morpholino, or thiotetrazole groups. In particular, the middle carbon of the methine chain can have one of these substituents.

For example, $R_1'$, $R_2'$, and $R_3'$ are independently hydrogen, a substituted or unsubstituted carbocyclic aryl group, and a substituted or unsubstituted heteroaryl group.

$R_{10}'$ and $R_{11}'$ are independently substituted or unsubstituted alkyl, cycloalkyl, or aryl groups. Possible substituents for such groups include alkoxy groups having up to 12 carbon atoms, and carboxy or sulfo groups. The same or different, substituted or unsubstituted methyl groups are useful for $R_{10}'$ and $R_{11}'$.

Z and Z' independently represent the carbon, nitrogen, oxygen, sulfur, or selenium atoms needed to form the same or different substituted or unsubstituted 5- to 14-membered N-containing heterocyclic rings with the illustrated carbon and nitrogen atoms, which rings can include two or more fused rings, one of which being a carbocyclic aromatic ring. These N-containing heterocyclic rings can be further substituted with the same or different one or more substituents including those defined above for $R_1'$-$R_3'$.

In the DYE I structure, s is at least 3, $Z_2^{\ominus}$ is a monovalent anion such as halo ions, a carboxy or sulfo (including arylsulfo), $ClO_4^-$, $BF_4^-$, $CF_3SO_3^-$, $PF_6^-$, $AsF_6^-$, $SbF_6^-$, and perfluoroethylcyclohexylsulfonate. Other anions include boron-containing counterions, methylbenzenesulfonic acid, benzenesulfonic acid, methanesulfonic acid, p-hydroxybenzenesulfonic acid, p-chlorobenzenesulfonic acid, and halides. Some useful IR-sensitive cyanine dyes include a borate anion, such as a tetra-substituted borate anion, which substituents can be the same or different alkyl (having 1 to 20 carbon atoms) or aryl groups (phenyl or naphthyl groups), which groups can be further substituted if desired. Particularly useful boron-containing counterions of this type include alkyltriarylborates, dialkyldiarylborates, and tetraarylborates. Examples of these boron-containing counterions are described for example, in EP 438,123A2 (Murofushi et al.).

The useful IR-sensitive cyanine dyes can also be described using the following Structure (DYE-II):

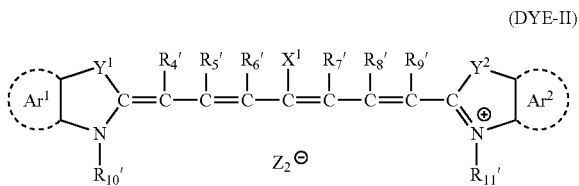

(DYE-II)

wherein $X^1$ is hydrogen or a halo, —$NPh_2$, or —$X^2$-$L^1$ group, or a group represented by the following Structure ($X_A$):

($X_A$)

wherein Ph represents a substituted or unsubstituted phenyl group, $X^2$ represents an oxy or thio group, $L^1$ represents a substituted or unsubstituted hydrocarbon group having 1 to 12 carbon atoms, a substituted or unsubstituted heteroaryl group having up to 12 atoms in the ring, or a substituted or unsubstituted non-aromatic heterocyclic group having up to 12 atoms in the ring, $R^a$ represents one or more of the same or different alkyl, aryl, amino, or halo substituents, and $Z_2^\ominus$ is as defined above.

$Y^1$ and $Y^2$ represent the same or different sulfur atom or substituted or unsubstituted methylene group (such as a dialkylmethylene group).

In addition, $Ar^1$ and $Ar^2$ are the same or different substituted or unsubstituted phenyl, naphthyl, or anthryl group. Possible substituents include alkyl, cycloalkyl, or aryl groups with up to 12 carbon atoms, halo groups, and alkoxy or aryloxy groups having up to 12 carbon atoms.

In Structure (DYE-II), $R_6'$ and $R_7'$ independently represent substituted or unsubstituted alkyl, cycloalkyl, or aryl groups having up to 12 carbon atoms, or they may be combined to form a substituted or unsubstituted 5- or 6-membered carbocyclic ring.

$R_4'$, $R_5'$, $R_8'$, and $R_9'$ are independently hydrogen or substituted or unsubstituted alkyl, cycloalkyl, or aryl groups having up to 12 carbon atoms, and in many embodiments, each is hydrogen.

$R_{10}'$ and $R_{11}'$ are independently substituted or unsubstituted alkyl, cycloalkyl, or aryl groups. Possible substituents for such groups include alkoxy groups having up to 12 carbon atoms, and carboxy or sulfo groups. The same or different, substituted or unsubstituted methyl groups are useful for $R_{10}'$ and $R_{11}'$.

Further details of useful IR-sensitive cyanine dyes, including representative IR dyes, are described in U.S. Pat. No. 7,135,271 (Kawauchi et al.) and the references cited in Col. 12 (lines 45-51) that is incorporated herein by reference for this IR cyanine dye description and representative compounds in Columns 12-14. In addition, useful IR dyes include but are not limited to, the following compounds, as well as the IR dyes identified as "66e", S0391, S0507, S0726, S0929, and S0930 shown and used below in the Examples:

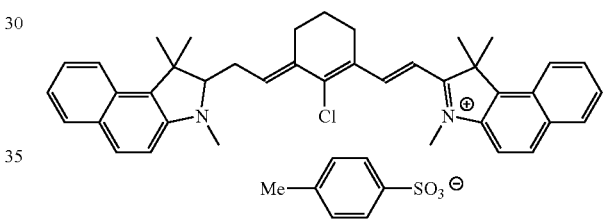

Same as above but with $Cl^-$ or $C_3F_7CO_2^-$ as the anion.

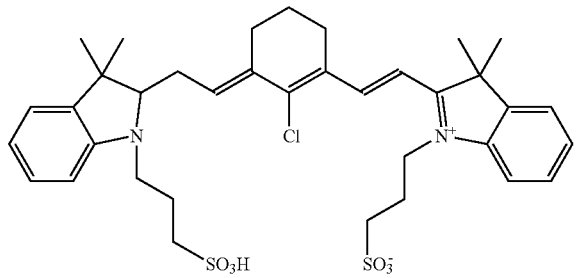

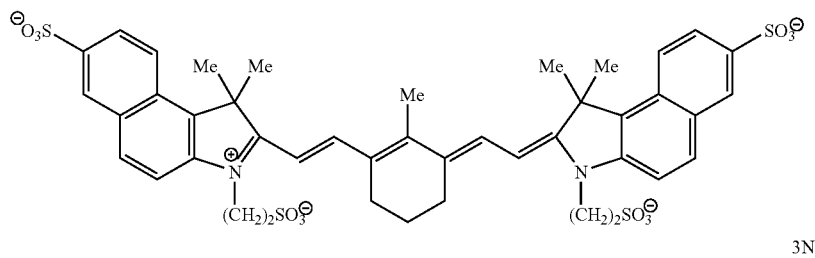

$3Na^+$

-continued
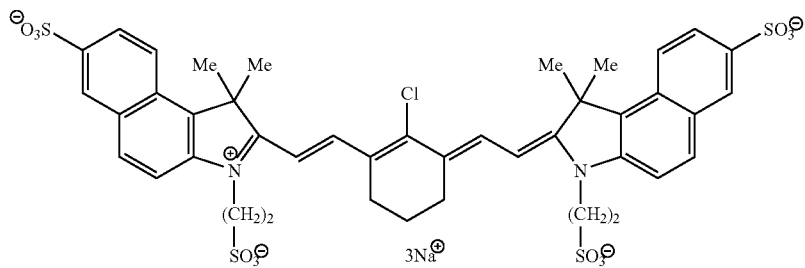
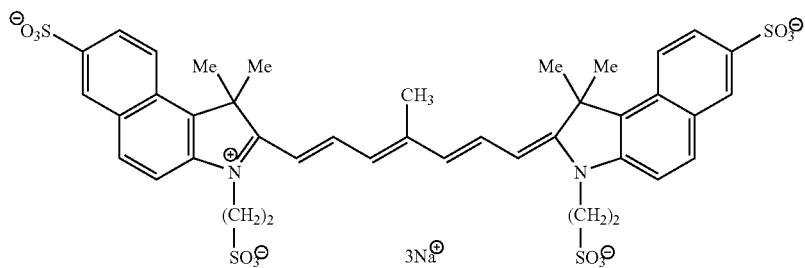
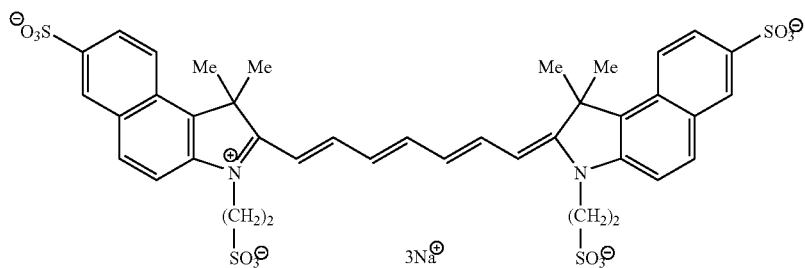
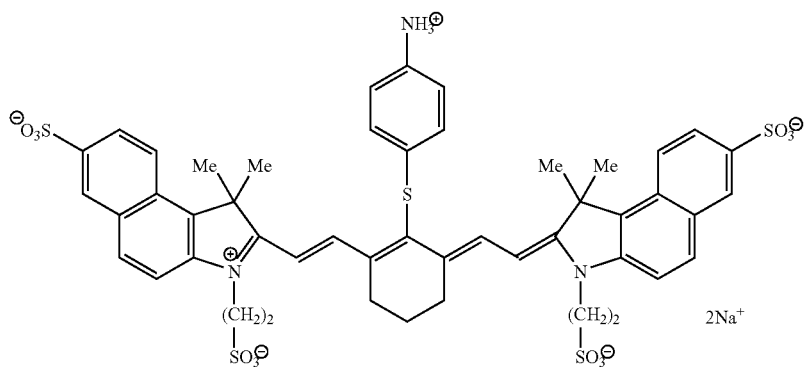
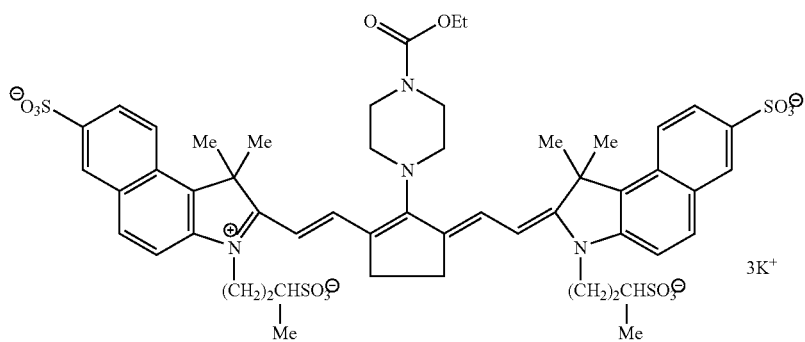

-continued

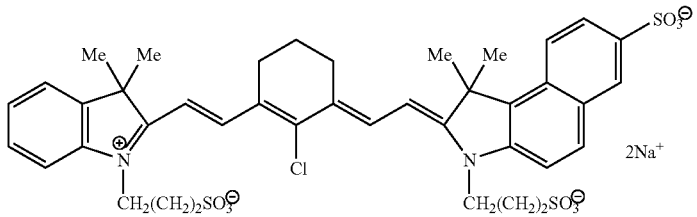

The infrared radiation-sensitive cyanine dye(s) can be present in the radiation-sensitive composition in an amount generally of at least 1% and up to and including 30% and typically at least 2 and up to and including 15%, based on total dry weight of the imageable layer. The particular amount needed for this purpose would be readily apparent to one skilled in the art, depending upon the specific compound used.

The imageable layer includes one or more primary polymeric binders that are particulate in nature.

Useful primary polymeric binders are particulate poly(urethane-acrylic) hybrids that are distributed (usually uniformly) throughout the imageable layer. Each of these hybrids has a molecular weight of from about 50,000 to about 500,000 and the particles have an average particle size of from about 10 to about 10,000 nm (preferably from about 30 to about 500 nm and more preferably from about 30 to about 150 nm). These hybrids can be either "aromatic" or "aliphatic" in nature depending upon the specific reactants used in their manufacture. Blends of particles of two or more poly(urethane-acrylic) hybrids can also be used. For example, a blend of Hybridur® 570 polymer dispersion with Hybridur® 870 polymer dispersion could be used.

It is also desirable that the poly(urethane-acrylic) hybrid particles remain insoluble in the following test:

0.1 g of particles is shaken for 24 hours at 20° C. in 10 g (1%) in an 80% aqueous solution (20% water) of either 2-butoxyethanol or 4-hydroxy-4-methyl-2-pentanone.

In general, the poly(urethane-acrylic) hybrids can be prepared by reacting an excess of diisocyanate with a polyol, dispersing the resulting polyurethane prepolymer in water. In some embodiments, the prepolymer contains carboxy groups. The prepolymers are then mixed with one or more vinyl monomers such as acrylates or styrene or substituted styrene monomers. Tertiary amines are added to the mixtures and they are dispersed in water, and oil-soluble initiators are added to begin polymerization. The resulting polymer hybrids are dispersed as colloidal particles. This dispersion is not merely a mixture or blend of a polyurethane dispersion and an acrylic emulsion. The urethane and acrylic polymerizations are completed concurrently. The acrylic-urethane hybrid dispersion can be anionically stabilized. It may also be free of N-methyl-pyrrolidone.

Synthetic methods for making these dispersions are provided, for example, in U.S. Pat. Nos. 3,684,758 (Honig et al.), 4,644,030 (Loewrigkeit et al.), and 5,173,526 (Vijayendran et al.), and by Galgoci et al. in JCT Coatings Tech. 2(13), 28-36 (February 2005).

Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly (urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents. Further details about each commercial Hybridur® polymer dispersion can be obtained by visiting the Air Products and Chemicals, Inc. website.

The primary polymeric binder is generally present in the radiation-sensitive composition in an amount of at least 10% and up to 90%, and typically from about 10 to about 70%, based on the total imageable layer dry weight. These binders may comprise up to 100% of the dry weight of all polymeric binders (primary polymeric binders plus any secondary polymeric binders).

Additional polymeric binders ("secondary" polymeric binders) may also be used in the imageable layer in addition to the primary polymeric binders. Such polymeric binders can be any of those known in the art for use in negative-working radiation-sensitive compositions other than those mentioned above. The secondary polymeric binder(s) may be present in an amount of from about 1.5 to about 70 weight % and typically from about 1.5 to about 40%, based on the dry coated weight of the imageable layer, and it may comprise from about 30 to about 60 weight % of the dry weight of all polymeric binders.

The secondary polymeric binders may be homogenous, that is, dissolved in the coating solvent, or may exist as discrete particles. Such secondary polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.). Also useful are the vinyl carbazole polymers described in copending and commonly assigned U.S. Ser. No. 11/356,518 (filed Feb. 17, 2006 by Tao et al.), and the polymers having pendant vinyl groups as described in copending and commonly assigned U.S. Ser. No. 11/349,376 (filed Feb. 7, 2006 by Tao et al.), both incorporated herein by reference. Copolymers of polyethylene glycol methacrylate/acrylonitrile/styrene in particulate form, dissolved copolymers derived from carboxyphenyl methacrylamide/acrylonitrile/methacrylamide/N-phenyl maleimide, copolymers derived from polyethylene glycol methacrylate/acrylonitrile/vinylcarbazole/-styrene/methylacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenylmaleimide are useful.

The imageable layer can further comprise one or more phosphate (meth)acrylates, each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety.

Each phosphate moiety is typically connected to an acrylate moiety by an aliphatic chain [that is, an -(aliphatic-O)— chain] such as an alkyleneoxy chain [that is an -(alkylene-O)$_m$— chain] composed of at least one alkyleneoxy unit, in which the alkylene moiety has 2 to 6 carbon atoms and can be either linear or branched and m is 1 to 10. For example, the alkyleneoxy chain can comprise ethyleneoxy units, and m is from 2 to 8 or m is from 3 to 6. The alkyleneoxy chains in a specific compound can be the same or different in length and have the same or different alkylene group.

Useful phosphate (meth)acrylates can be represented by the following Structure (I):

   (I)

wherein n is 1 or 2, M is hydrogen or a monovalent cation (such as an alkali metal ion, ammonium cations including cations that include one to four hydrogen atoms). For example, useful M cations include but are not limited to sodium, potassium, —NH$_4$, —NH(CH$_2$CH$_2$OH)$_3$, and —NH$_3$(CH$_2$CH$_2$OH). When n is 2, the M groups are the same or different. The compounds wherein M is hydrogen are particularly useful.

The R groups are independently the same or different groups represented by the following Structure (II):

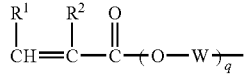   (II)

wherein R$^1$ and R$^2$ are independently hydrogen, or a halo (such as chloro or bromo) or substituted or unsubstituted alkyl group having 1 to 6 carbon atoms (such as methyl, chloromethyl, methoxymethyl, ethyl, isopropyl, and t-butyl groups). In many embodiments, one or both of R$^1$ and R$^2$ are hydrogen or methyl, and in some embodiments, R$^1$ is hydrogen and R$^2$ is methyl).

W is an aliphatic group having at least 2 carbon or oxygen atoms, or combination of carbon and oxygen atoms, in the chain, and q is 1 to 10. Thus, W can include one or more alkylene groups having 1 to 8 carbon atoms that are interrupted with one or more oxygen atoms (oxy groups), carbonyl, oxycarbonyl, or carbonyl oxy groups. For example, one such aliphatic group is an alkylenecarbonyloxyalkylene group. Useful alkylene groups included in the aliphatic groups have 2 to 5 carbon atoms and can be branched or linear in form.

The R groups can also independently be the same or different groups represented by the following Structure (IIa):

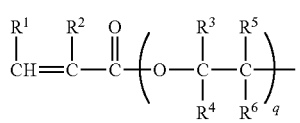   (IIa)

wherein R$^1$, R$^2$, and q are as defined above and R$^3$ through R$^6$ are independently hydrogen or a substituted or unsubstituted alkyl group having 1 to 6 carbon atoms (such as methyl, methoxymethyl), ethyl, chloromethyl, hydroxymethyl, ethyl, iso-propyl, n-butyl, t-butyl, and n-pentyl groups). Typically, R$^3$ through R$^6$ are independently hydrogen or methyl, and in most embodiments, all are hydrogen.

In Structures II and IIa, q is 1 to 10, or from 2 to 8, for example from 3 to 6.

Representative phosphate (meth)acrylates useful in this invention include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan) that is shown below, a phosphate of a di(caprolactone modified 2-hydroxyethyl methacrylate) that is available as Kayamer PM-21 (Nippon Kayaku, Japan) that is also shown below, and a polyethylene glycol methacrylate phosphate with 4-5 ethoxy groups that is available as Phosmer PE from Uni-Chemical Co., Ltd. (Japan) that is also shown below. Other useful nonionic phosphate acrylates are also shown below.

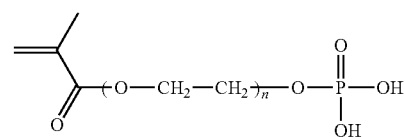

Phosmer PE (n = 4 or 5)

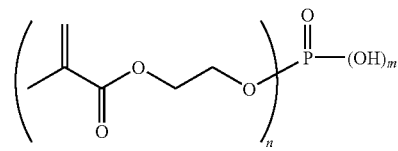

Kayamer PM-2 (m = 1 or 2, n = 3 - m)

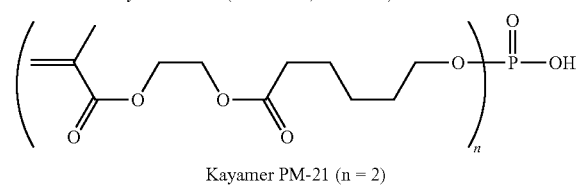

Kayamer PM-21 (n = 2)

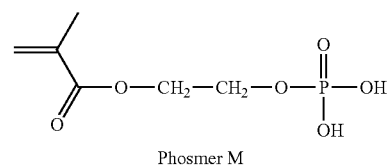

Phosmer M

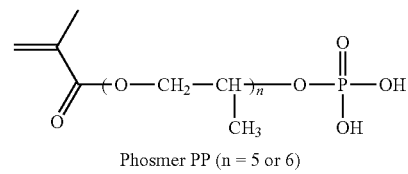

Phosmer PP (n = 5 or 6)

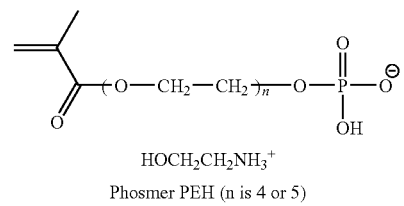

HOCH$_2$CH$_2$NH$_3^+$

Phosmer PEH (n is 4 or 5)

-continued

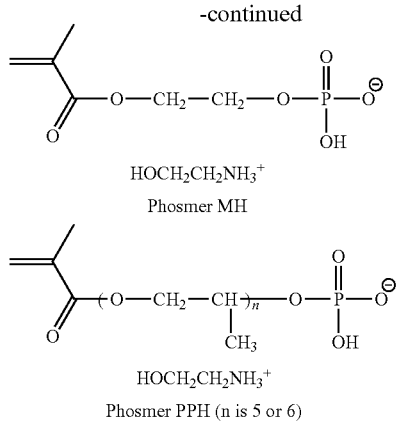

Phosmer MH

Phosmer PPH (n is 5 or 6)

The phosphate acrylate can be present in the imageable layer in an amount of at least 0.5 and up to and including 20% and typically at least 0.9 and up to and including 10%, by weight of the total solids.

The imageable layer can also include a "primary additive" that is a poly(alkylene glycol) or an ether or ester thereof that has a molecular weight of at least 200 and up to and including 4000. This primary additive is present in an amount of at least 2 and up to and including 50 weight %, based on the total dry weight of the imageable layer. Particularly useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The imageable layer can also include a "secondary additive" that is a poly(vinyl alcohol), a poly(vinyl pyrrolidone), poly(vinyl imidazole), or polyester in an amount of up to and including 20 weight % based on the total dry weight of the imageable layer.

The imageable layer can also include a variety of optional compounds including but not limited to, dispersing agents, humectants, biocides, plasticizers, surfactants for coatability or other properties, viscosity builders, dyes or colorants to allow visualization of the written image (such as crystal violet, methyl violet, ethyl violet, Victoria blue, malachite green, and brilliant green), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imageable Elements

The imageable elements can be formed by suitable application of a radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition. If the substrate has been treated to provide an "interlayer" for improved adhesion or hydrophilicity, the applied imageable layer is disposed thereon but these interlayers are not considered "imageable layers".

The element also includes what is conventionally known as an overcoat (also known as an "oxygen impermeable topcoat" or "oxygen barrier layer") disposed over the imageable layer. Such overcoat layers predominantly comprise one or more poly(vinyl alcohol)s as the predominant polymeric binders, each of which has a hydrolysis level of up to 85%, typically from about 60 and up to and including 85% and more typically from about 75 and up to and including 85%. By "hydrolysis level", we are referring to the specific percentage of acetate moieties in the polymer having been converted to hydroxyl groups. Thus, vinyl acetate is polymerized to form poly(vinyl acetate) and a hydroxide (usually sodium or potassium hydroxide) is used to convert acetate groups to hydroxyl groups.

While the poly(vinyl alcohol)s described above can comprise up to 100% of the total overcoat dry weight, usually, they comprise at least 60 and up to 95% of the total overcoat dry weight. The overcoat thus can include up to 40 weight % of other components including but not limited to, other polymeric binders such as poly(vinyl pyrrolidone), poly(ethyleneimine), poly(vinyl imidazole), copolymers from two or more of vinyl pyrrolidone, ethyleneimine and vinyl imidazole, and mixtures of such polymers, and well as cationic, anionic, and non-ionic wetting agents or surfactants, flow improvers or thickeners, antifoamants, colorants, particles such as aluminum oxide and silicon dioxide, and biocides. Details about such addenda are provided in WO 99/06890 (Pappas et al.).

The dry overcoat coating weight is generally at least 0.1 and up to and including 4 $g/m^2$ and typically from about 1 to about 2.5 $g/m^2$.

The overcoat can be disposed over the imageable layer by applying a coating formulation containing the desired poly(vinyl alcohol) and any other components in a suitable solvent or mixture of solvents (such as isopropyl alcohol, water, or both) to the dried imageable layer, and suitable drying procedures. Representative coating formulations and methods of applying them are described in the Examples below.

The substrate generally has a hydrophilic surface, or at least a surface that is more hydrophilic than the applied imageable layer on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of from about 1.5 to about 5 $g/m^2$ and more typically from about 3 to about 4.3 $g/m^2$. Phosphoric acid anodization generally provides an oxide weight on the surface of from about 1.5 to about 5 $g/m^2$ and more typically from about 1 to about 3 $g/m^2$. When sulfuric acid is used for anodization, higher oxide weight (at least 3 $g/m^2$) may provide longer press life.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth) acrylic acid], or acrylic acid copolymer to increase hydrophilicity. Still further, the aluminum support may be treated with a phosphate solution that may further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imageable element.

The substrate can also be a cylindrical surface having the imageable layer thereon, and thus be an integral part of the printing press. The use of such imaging cylinders is described for example in U.S. Pat. No. 5,713,287 (Gelbart).

A radiation-sensitive composition containing the components described above can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such manufacturing methods is mixing the free radically polymerizable component, primary polymeric binder, initiator composition, IR-sensitive cyanine dye, and any other components of the radiation-sensitive composition in a suitable coating solvent including water, organic solvents [such as glycol ethers including 1-methoxypropan-2-ol, methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], or mixtures thereof, applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.1 and up to and including 5 $g/m^2$ or at least 0.5 and up to and including 3.5 $g/m^2$. Any particulate primary polymeric binders present in the imageable layer may partially coalesce or be deformed during the drying operation.

Layers can also be present under the imageable layer to enhance developability or to act as a thermal insulating layer. The underlying layer should be soluble or at least dispersible in the developer and typically have a relatively low thermal conductivity coefficient.

The various layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the imageable element can be enclosed in water-impermeable material that substantially inhibits the transfer of moisture to and from the imageable element.

By "enclosed", we mean that the imageable element is wrapped, encased, enveloped, or contained in a manner such that both upper and lower surfaces and all edges are within the water-impermeable sheet material. Thus, none of the imageable element is exposed to the environment once it is enclosed.

Useful water-impermeable sheet materials include but are not limited to, plastic films, metal foils, and waterproof papers that are usually in sheet-form and sufficiently flexible to conform closely to the shape of the imageable element (or stack thereof as noted below) including an irregularities in the surfaces. Typically, the water-impermeable sheet material is in close contact with the imageable element (or stack thereof). In addition, this material can be sufficiently tight or is sealed, or both, so as to provide a sufficient barrier to the movement or transfer of moisture to or from the imageable element. Useful water-impermeable materials include plastic films such as films composed of low density polyethylene, polypropylene, and poly(ethylene terephthalate), metallic foils such as foils of aluminum, and waterproof papers such as papers coated with polymeric resins or laminated with metal foils (such as paper backed aluminum foil). In addition, the edges of the water-impermeable sheet materials can be folded over the edges of the imageable elements and sealed with suitable sealing means such as sealing tape and adhesives.

The transfer of moisture from and to the imageable element is "substantially inhibited", meaning that over a 24-hour period, the imageable element neither loses nor gains no more than 0.01 g of water per $m^2$. The imageable element (or stack) can be enclosed or wrapped while under vacuum to remove most of the air and moisture. In addition to or instead of vacuum, the environment (for example, humidity) of the imageable element can be controlled (for example to a relative humidity of less than 20%), and a desiccant can be associated with the imageable element (or stack).

For example, the imageable element can be enclosed with the water-impermeable sheet material as part of a stack of imageable elements, which stack contains at least 5 imageable elements and more generally at least 100 or at least 500 imageable elements that are enclosed together. It may be desirable to use "dummy", "reject", or non-photosensitive elements at the top and bottom of the stack improve the wrapping. Alternatively, the imageable element can be enclosed in the form of a coil that can be cut into individual elements at a later time. Generally, such a coil has at least 1000 m$^2$ of imageable surface, and commonly at least 3000 m$^2$ of imageable surface.

Adjacent imageable elements in the stacks or adjacent spirals of the coil may be separated by interleaving material, for example interleaving paper or tissue ("interleaf paper") that may be sized or coated with waxes or resin (such as polyethylene) or inorganic particles. Many useful interleaving materials are commercially available. They generally have a moisture content of less than 8% or typically less than 6%.

Imaging Conditions

During use, the imageable element is exposed to a suitable source of imaging or exposing radiation such as near-infrared or infrared radiation, depending upon the infrared radiation absorbing cyanine dye present in the radiation-sensitive composition, at a wavelength of from about 700 to about 1500 nm. For example, imaging can be carried out using imaging or exposing radiation, such as from an infrared laser at a wavelength of at least 750 nm and up to and including about 1400 nm and typically at least 700 nm and up to and including 1200 nm. Imaging can be carried out using imaging radiation at multiple wavelengths at the same time if desired.

The laser used to expose the imageable element is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

While laser imaging is desired in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

With or without a post-exposure baking step after imaging and before development, the imaged elements can be developed "off-press" using conventional processing and an aqueous alkaline or organic solvent-containing developer. Alternatively, the imaged elements can be developed, or imaged and developed, "on-press" as described in more detail below.

For off-press development, the aqueous alkaline developer composition commonly includes one or more ingredients selected from the group consisting of surfactants, chelating agents (such as salts of ethylenediaminetetraacetic acid), organic solvents (such as benzyl alcohol), and alkaline components (such as inorganic metasilicates, organic metasilicates, hydroxides, bicarbonates, organic amines, and sodium triphosphates). The pH of the alkaline developer is typically at least 8 and up to and including 14. The imaged elements are generally developed using conventional processing conditions.

Developers commonly used for conventional negative-working elements may also be used. Such developers are typically single-phase solutions containing organic solvents that are miscible or dispersible in water, surfactants, alkali agents, and other additives such as chelating agents, antifoamants, and algicides. The pH values of such aqueous alkaline developers are typically less than 12 and typically in the range of from about 7 to about 12. Useful organic solvents include the reaction products of phenol with ethylene oxide and propylene oxide [such as ethylene glycol phenyl ether (phenoxyethanol)], benzyl alcohol, esters of mono- di-, or triethylene glycol and of mono-, di-, or tripropylene glycol with acids having 6 or less carbon atoms, and ethers of mono-, di-, or triethylene glycol, diethylene glycol, and of mono-, di-, or tripropylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative developers useful in this invention include but are not limited to, ND-1 Developer, Developer 980, SP 200 Developer, "2-in-1" Developer, ProNeg D-501 Developer, 955 Developer, and 956 Developer (available from Eastman Kodak Company).

Developers commonly used for developing conventional positive-working elements may also be used. Such developers typically contain alkali agents (such as alkali metal silicate or metasilicates, alkali metal hydroxides, alkali metal triphosphates, and alkali metal carbonates), and optional additives such as surfactants, anticorrosion agents, chelating agents, antifoamants, and coating protection agents. Such developers generally have a pH of at least 11 and typically of at least 13. Useful developers of this type include 3000 Developer, 9000 Developer, GOLDSTAR Developer, GREENSTAR Developer, ThermalPro Developer, PROTHERM Developer, MX1813 Developer, TCD-300 Developer, and MX1710 Developer (all available from Eastman Kodak Company).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following off-press development, the imaged element can be rinsed with water and dried in a suitable fashion. The dried element can also be treated with a conventional gumming solution (such as gum Arabic desensitizing solution). In addition, a postbake operation can be carried out, with or without a blanket or floodwise exposure to UV or visible radiation. Alternatively, a blanket UV or visible radiation exposure can be carried out, without a postbake operation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imageable elements of this invention are designed for development "on-press". This type of development avoids the use of the developing solutions described above. The imaged element is directed mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The following examples are provided to illustrate the practice of the invention but are by no means intended to limit the invention in any manner.

EXAMPLES

Unless otherwise noted below, the chemical components used in the Examples can be obtained from one or more commercial courses such as Aldrich Chemical Company (Milwaukee, Wis.).

The components and materials used in the examples and analytical methods used in evaluation were as follows:

Aqua image cleaner/preserver is available from Eastman Kodak Company (Rochester, N.Y.).

Bayhydrol® UV VP LS 2280 is a 39% by weight aqueous urethane acrylate dispersion that is available from Bayer MaterialScience.

BLO represents γ-butyrolactone.

Elvanol® 5105 is a poly(vinyl alcohol) that was obtained from Dupont (Wilmington, Del.).

FluorN™ 2900 is a fluorosurfactant that was obtained from Cytonix Corporation (Beltsville, Md.).

Hybridur® 580 is a urethane-acrylic hybrid polymer dispersion (40%) that was obtained from Air Products and Chemicals, Inc. (Allentown, Pa.).

IB05 represents bis(4-t-butylphenyl) iodonium tetraphenylborate.

IBPF is bis(4-t-butylphenyl)iodonium hexafluorophosphate that was obtained from Sanwa Chemical Co., Ltd. (Japan).

IPA represents iso-propyl alcohol.

IRT is an IR Dye that was obtained from Showa Denko (Japan).

Masurf® FS-1520 is a fluoroaliphatic betaine fluorosurfactant that was obtained from Mason Chemical Company (Arlington Heights, Ill.).

MEK represents methyl ethyl ketone.

Mowiol 488 is poly(vinyl alcohol) with a hydrolysis degree of about 88% that was obtained from Kuraray American Inc. (New York, N.Y.).

Mowiol 385 is poly(vinyl alcohol) with a hydrolysis degree of about 85% that was obtained from Kuraray American Inc.

Mowiol 383 is poly(vinyl alcohol) with a hydrolysis degree of about 83% that was obtained from Clariant Corp. (Charlotte, N.C.).

Mowiol 480 is poly(vinyl alcohol) with a hydrolysis degree of about 80% that was obtained from Clariant Corp.

N-BAMAAm represents benzoic acid methacrylamide or carboxyphenyl methacrylamide.

NK Ester A-DPH is a dipentaerythritol hexaacrylate that was obtained from Kowa American (New York, N.Y.).

Oligomer 1 is a 30% by weight solution in ethyl acetate of a urethane acrylate prepared by reacting 2 parts of hexamethylene diisocyanate, 2 parts of hydroxyethyl methacrylate, and 1 part of 2-(2-hydroxyethyl)piperidine.

Oligomer 2 urethane acrylate was prepared by reacting 1-methyl-2,4-bis-isocyanate benzene with hydroxyethyl acrylate and pentaerythritol triacrylate.

PGME represents 1-methoxy-2-propanol and it is also known as Dowanol PM.

Phosmer PE is an ethylene glycol methacrylate phosphate with 4-5 ethoxy groups that was obtained from Uni-Chemical Co. Ltd. (Japan).

Pigment A is a 27% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4) and 15.4 parts of Disperbyk® 167 dispersant (Byk Chemie) in 1-methoxy-2-propanol.

Polymer A is a 37/48/10/5 weight percent copolymer of N-benzoic acid methacrylamide/acrylonitrile/methacrylamide/N-phenyl maleimide.

Prisco LPC is a liquid plate cleaner that was obtained from Printer's Service (Newark, N.J.).

S0391 is an IR dye that was obtained from FEW Chemicals GmbH (Germany):

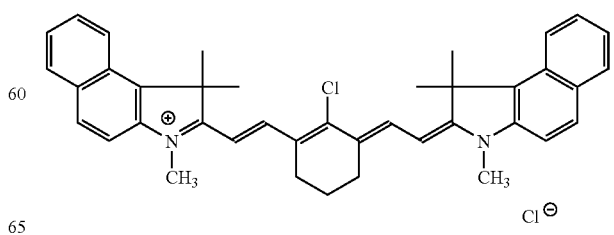

S0507 is an IR dye that was obtained from FEW Chemicals GmbH (Germany):

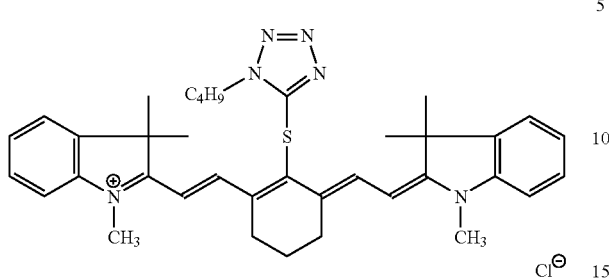

S0726 is an IR dye obtained from FEW Chemicals GmbH (Germany):

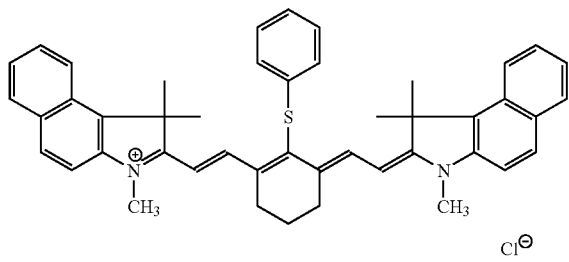

S0929 is an IR dye obtained from FEW Chemicals GmbH (Germany):

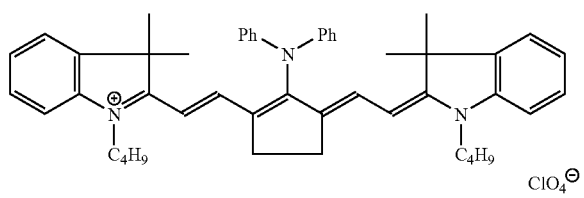

S0930 is an IR dye obtained from FEW Chemicals GmbH (Germany):

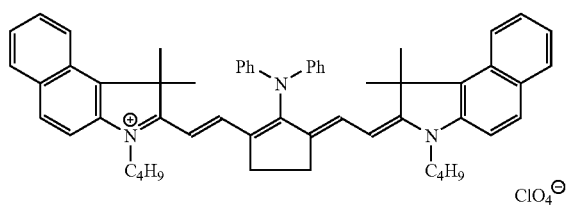

66c represents the IR dye shown as follows that was obtained from FEW Chemicals GmbH (Germany):

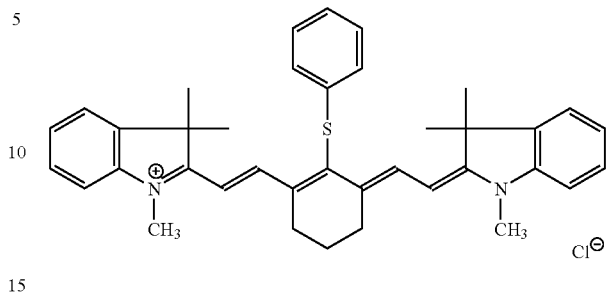

Sartomer 399 is dipentaerythritol pentaacrylate that was obtained from Sartomer Company, Inc.

Triazine A is 2-(4-methoxyphenyl)-4,6-bis(trichloromethyl)-2-triazine that was obtained from Panchim S.A. (Lisses, France).

UV plate cleaner was obtained from Allied Pressroom Chemistry, Inc. (Hollywood, Fla.).

Varn Litho Etch 142W fountain solution was obtained from Varn International (Addison, Ill.).

Varn-120 plate cleaner was obtained from Varn International.

Varn PAR alcohol replacement was obtained from Varn International.

Zonyl® FSN-100 is a non-ionic fluorosurfactant that was obtained from Dupont (Mississauga, Ontario, CA).

The "DH Test" used in the following Examples was a dry-heat accelerated aging test carried out at 48° C. for 5 days.

The "RH Test" used in the following Examples was a high humidity accelerated aging test carried out at 38° C. and a relative humidity of 85% for 5 days.

Invention Example 1

An imageable layer formulation was prepared by dissolving or dispersing 1.1 g of Hybridur® 580 dispersion, 3.3 g of Polymer A (10% in MEK/PGME/BLO/water at 5:2:1:1 ratio, acid number of 98 mg KOH/g), 0.5 g of SR399, 0.5 g of NK ester A-DPH, 0.1 g of Phosmer PE, 0.18 g of IB-05, 0.05 g of S0507, 0.3 g of Pigment A, and 0.4 g of FluorN™ 2900 (5% in PGME) in 3.5 g of PGME, 1.2 g of BLO, 5.7 g of MEK, 1 g of methanol, and 0.6 g of water. The imageable layer formulation was applied to an electrochemically grained and sulfuric acid anodized aluminum substrate that had been post-treated with poly(vinyl phosphoric acid) to provide a dry coating weight of about 1.2 g/m².

On the resulting imageable layers, three different topcoat formulations were applied, each formulation comprising 4 g of a poly(vinyl alcohol) with hydrolysis level of less than, or equal to about 85%, 4 g of IPA, 92 g of water, and 0.02 g of Masurf® FS-1520 to provide a dry coating weight of about 0.4 g/m². The three different poly(vinyl alcohol) resins used in these formulations were Mowiol 385, Mowiol 383, and Mowiol 480. Both the imageable layer and topcoat formulations were applied using a wire-wound rod and then dried for approximately 60 seconds in a Ranar conveyor oven set at 120° C.

The following tests were performed on the resulting imageable elements:

a) expose to white light of 600 lux,
b) expose to yellow light of 500 lux, c) expose to an 830 nm IR laser on a CREO Trendsetter® 3244x image setter,
d) subject to "DH" test as identified above, and
e) subject to "RH" test as identified above.

All the exposed elements were then developed in a NE34 processor charged with 956 Developer (Eastman Kodak Company) at a speed of 5 ft/min. (1.5 m/min.) at 23° C. None of the resulting printing plates showed any fogging (no stain on the background) in 8 hour white light exposure and in 40 hour yellow light exposure. They all required minimum exposure energy of about 20-25 mJ/m² to achieve a solid image. All of the printing plates also passed both "DH" and "RH" tests without significant changes in plate developability and speed.

The developed printing plate containing Mowiol 480 in the topcoat was tested on Miehle sheet-fed press using a wear ink containing 1.5% calcium carbonate and fountain solution containing Varn Litho Etch 142W at 3 oz./gal. (23.4 ml/liter) and PAR alcohol replacement at 3 oz./gal. (23.4 ml/liter). A chemical resistance test was performed at 5,000 impressions by applying UV plate cleaner and Vam-120 plate cleaner in different areas to the image of the printing plate and resuming printing without any cleaning after 10-15 minutes. Using an exposure energy of 65 mJ/cm², the image recovered with 10 impressions and did not show any degradation on the solid images due to the plate cleaners. At the end of the workday, the printing plate was cleaned with Aqua-image cleaner/preserver and left mounted on the printing press until the next morning. Upon start-up, the printing plate performed identically to the previous evening. At the fully wearing condition, the printing plate did not show any solid wear and highlight fading (AM200) at 55,000 impressions.

While the imageable element described above was prepared on a laboratory scale, it was also scaled up for manufacturing and retested in the following manner:

The imageable layer formulation described above (28 kg) was prepared to give a 5.85 w/w solution in a solvent mixture of MEK/PGME/BLO/water at 5:2:1:1 weight ratio. This formulation was applied using a slot coater at 2.1 cm³/ft² (22.7 cm³/m²) coating speed to give a dry film coverage of 1.2 g/m² after drying by forced air, hot air oven at 157° C. for 10 seconds, and 104° C. for 10 seconds. The topcoat formulation (28 kg) described above was then prepared to give a 1.77 w/w solution in water/isopropyl alcohol (96:4 weight ratio), and applied to the dried imageable layer using a slot coater at 22.7 cm³/m² coating speed to give a dry film coverage of 0.4 g/m² after drying in a hot air oven at 110° C. for 20 seconds.

The resulting imageable element was imaged on a CREO Trendsetter® 3244x image setter and an 830 nm IR laser. The imaged element was then developed as described above. The minimum exposure energy needed to achieve a solid image was about 25 mJ/cm².

The resulting printing plate passed both 5-day DH and RH tests described above without any reduction in developability and imaging speed. When the printing plate was subjected to test a) as described above, it showed no fogging (stain on the background) after 8 hours of white light exposure of 600 lux.

Comparative Example 1

On the same imageable layers described in Invention Example 1, another two different topcoat formulations were applied, each comprising 4 g of a poly(vinyl alcohol) with a hydrolysis level of more than about 85%, 4 g of IPA, 92 g of water, and 0.02 g of Masurf® FS-1520 to provide a dry coating weight of about 0.4 g/m². The two poly(vinyl alcohol) resins used were Elvanol® 5105 and Mowiol 488. Both the imageable layer and topcoat formulations were applied using a wire-wound rod and then dried for approximately 60 seconds in a Ranar conveyor oven set at 120° C. The resulting imageable elements did not show any fogging after 40 hour yellow light exposure but showed fog in less than 1 hour when exposed to white light as described in Invention Example 1.

Invention Example 2

An imageable layer formulation was prepared by dissolving or dispersing 1.1 g of Hybridur® 580 dispersion, 3.3 g of Polymer A (10% in MEK/PGME/BLO/water at 5:2:1:1 ratio, acid number of 98 mg KOH/g), 0.5 g of SR399, 0.5 g of NK ester A-DPH, 0.1 g of Phosmer PE, 0.18 g of IB-05, 0.05 g of S0726, 0.3 g of Pigment A, and 0.4 g of FluorN™ 2900 (5% in PGME) in 3.5 g of PGME, 1.2 g of BLO, 5.7 g of MEK, 1 g of methanol, and 0.6 g of water. The imageable layer formulation was applied to an electrochemically grained and sulfuric acid anodized aluminum substrate that had been post-treated with poly(vinyl phosphonic acid) to provide a dry coating weight of about 1.2 g/m².

On the resulting imageable layers, three different topcoat formulations were applied, each comprising 4 g of a poly(vinyl alcohol) with hydrolysis level of less than, or equal to about 85%, 4 g of IPA, 92 g of water, and 0.02 g of Masurf® FS-1520 to provide a dry coating weight of about 0.4 g/m². The three different poly(vinyl alcohol) resins used in these formulations were Mowiol 385, Mowiol 383, and Mowiol 480. Both the imageable layer and topcoat formulations were applied using a wire-wound rod and then dried for approximately 60 seconds in a Ranar conveyor oven set at 120° C.

The five tests described in Invention Example 1 were performed on the resulting imageable elements. All the exposed elements were then developed as described above in Invention Example 1. None of the printing plates showed any fogging (no stain on the background) in 8 hour white light exposure and in 40 hour yellow light exposure. They all required minimum exposure energy of about 25-30 mJ/cm² to achieve a solid image. All of the printing plates also passed both "DH" and "RH" tests without significant changes in plate developability and speed.

Comparative Example 2

On the same imageable layers disclosed in Invention Example 2, another two different topcoat formulations were applied, each comprising 4 g of a poly(vinyl alcohol) with a hydrolysis level of more than about 85%, 4 g of IPA, 92 g of water, and 0.02 g of Masurf® FS-1520 to provide a dry coating weight of about 0.4 g/m². The two poly(vinyl alcohol) resins used in these formulations were Elvanol® 5105 and Mowiol 488. Both the imageable layer and topcoat formulations were applied using a wire-wound rod and then dried for approximately 60 seconds in a Ranar conveyor oven set at 120° C.

The resulting imageable elements did not show any fogging after the 40 hour yellow light test but fogged in less than 1 hour white light exposure as described in the Invention Example 2.

Invention Example 3

An imageable layer formulation was prepared by dissolving or dispersing 1.1 g of Hybridur® 580 dispersion, 3.3 g of Polymer A (10% in MEK/PGME/BLO/water at 5:2:1:1 ratio, acid number of 98 mg KOH/g), 0.5 g of SR399, 0.5 g of NK ester A-DPH, 0.1 g of Phosmer PE, 0.18 g of IB-05, 0.05 g of 66e, 0.3 g of Pigment A, and 0.4 g of FluorN™ 2900 (5% in PGME) in 3.5 g of PGME, 1.2 g of BLO, 5.7 g of MEK, 1 g of methanol, and 0.6 g of water. The imageable layer formulation was applied to an electrochemically grained and sulfuric acid anodized aluminum substrate that had been post-treated with poly(vinyl phosphonic acid) to provide a dry coating weight of about 1.2 g/m$^2$.

On the resulting imageable layers, three different topcoat formulations were applied, each comprising 4 g of a poly (vinyl alcohol) with hydrolysis level of less than, or equal to about 85%, 4 g of IPA, 92 g of water, and 0.02 g of Masurf® FS-1520 to provide a dry coating weight of about 0.4 g/m$^2$. The three different poly(vinyl alcohol) resins used were Mowiol 385, Mowiol 383, and Mowiol 480. Both the imageable layer and topcoat formulations were applied using a wire-wound rod and then dried for approximately 60 seconds in a Ranar conveyor oven set at 120° C.

The five tests described in Invention Example 1 were performed on the resulting imageable elements. All of the exposed elements were then developed as described in Invention Example 1. None of the printing plates showed any fogging (no stain on the background) in the 8 hour white light exposure and 40 hour yellow light exposure. They all required minimum exposure energy of about 25-30 mJ/cm$^2$ to achieve a solid image. All of the printing plates also passed both "DH" and "RH" tests without significant changes in plate developability and speed.

Comparative Example 3

On the same imageable layers disclosed in Invention Example 3, another two topcoat formulations were applied, each comprising 4 g of a poly(vinyl alcohol) with hydrolysis level of more than about 85%, 4 g of IPA, 92 g of water, and 0.02 g of Masurf® FS-1520 to provide a dry coating weight of about 0.4 g/m$^2$. The two poly(vinyl alcohol) resins used were Elvanol® 5105 and Mowiol 488. Both the imageable layer and topcoat formulations were applied using a wire-wound rod and then dried for approximately 60 seconds in a Ranar conveyor oven set at 120° C. The resulting imageable elements did not show any fogging after 40 hour yellow light tests but fogged in less than 1 hour under the white light as described in the Invention Example 3.

Invention Example 4

An imageable layer formulation was prepared by dissolving or dispersing 1.1 g of Hybridur® 580 dispersion, 3.3 g of Polymer A (10% in MEK/PGME/BLO/water at 5:2:1:1 ratio, acid number of 98 mg KOH/g), 0.5 g of SR399, 0.5 g of NK ester A-DPH, 0.1 g of Phosmer PE, 0.18 g of IB-05, 0.05 g of S0391, 0.3 g of Pigment A, and 0.4 g of FluorN™ 2900 (5% in PGME) in 3.5 g of PGME, 1.2 g of BLO, 5.7 g of MEK, 1 g of methanol, and 0.6 g of water. The imageable layer formulation was applied to an electrochemically grained and sulfuric acid anodized aluminum substrate that had been post-treated with poly(vinyl phosphoric acid) to provide a dry coating weight of about 1.2 g/m$^2$.

On the resulting imageable layers, three different topcoat formulations were applied, each comprising 4 g of a poly (vinyl alcohol) with hydrolysis level of less than, or equal to about 85%, 4 g of IPA, 92 g of water, and 0.02 g of Masurf® FS-1520 to provide a dry coating weight of about 0.4 g/m$^2$. The three different poly(vinyl alcohol) resins used were Mowiol 385, Mowiol 383, and Mowiol 480. Both the imageable layer and topcoat formulations were applied using a wire-wound rod and then dried for approximately 60 seconds in a Ranar conveyor oven set at 120° C.

The five tests described in Invention Example 1 were performed on the resulting imageable elements. All the exposed elements were then developed as described in Invention Example 1. None of the printing plates showed any fogging (no stain on the background) in 8 hour white light exposure and in 40 hour yellow light exposure. They all required minimum exposure energy of about 25-30 mJ/cm$^2$ to achieve a solid image. All the plates also passed both "DH" and "RH" tests without significant changes in plate developability and speed.

Comparative Example 4

On the same imageable layers disclosed in the Example 4, another two topcoat formulations were applied, each comprising 4 g of a poly(vinyl alcohol) with hydrolysis level of more than about 85%, 4 g of IPA, 92 g of water, and 0.02 g of Masurf® FS-1520 to provide a dry coating weight of about 0.4 g/m$^2$. The two poly(vinyl alcohol) resins used were Elvanol® 5105 and Mowiol 488. Both the imageable and topcoat formulations were applied using a wire-wound rod and then dried for approximately 60 seconds in a Ranar conveyor oven set at 120° C. The resulting imageable elements did not show any fogging after the 40 hour yellow light test but fogged in less than 1 hour of white light exposure as described in Invention Example 4.

Invention Example 5

An imageable layer formulation was prepared by dissolving or dispersing 1.1 g of Hybridur® 580 dispersion, 3.3 g of Polymer A (10% in MEK/PGME/BLO/water at 5:2:1:1 ratio, acid number of 98 mg KOH/g), 0.5 g of SR399, 0.5 g of NK ester A-DPH, 0.1 g of Phosmer PE, 0.18 g of IB-05, 0.05 g of S0929, 0.3 g of Pigment A, and 0.4 g of FluorN™ 2900 (5% in PGME) in 3.5 g of PGME, 1.2 g of BLO, 5.7 g of MEK, 1 g of methanol, and 0.6 g of water. The imageable layer formulation was applied to an electrochemically grained and sulfuric acid anodized aluminum substrate that had been post-treated with poly(vinyl phosphonic acid) to provide a dry coating weight of about 1.2 g/m$^2$.

On the resulting imageable layers, three different topcoat formulations were applied, each comprising 4 g of a poly (vinyl alcohol) with hydrolysis level of less than, or equal to about 85%, 4 g of IPA, 92 g of water, and 0.02 g of Masurf® FS-1520 to provide a dry coating weight of about 0.4 g/m$^2$. The three different poly(vinyl alcohol) resins used were Mowiol 385, Mowiol 383, and Mowiol 480. Both the imageable layer and topcoat formulations were applied using a wire-wound rod and then dried for approximately 60 seconds in a Ranar conveyor oven set at 120° C.

The five tests described in Invention Example 1 were performed on the resulting imageable elements. All of the exposed elements were then developed as described in Invention Example 1. None of the printing plates showed any fogging (no stain on the background) in the 8 hour white light exposure and in 40 hour yellow light exposure. They all required minimum exposure energy of about 20 mJ/cm$^2$ to achieve a solid image. All of the plates also passed both "DH" and "RH" tests without significant changes in plate developability and speed.

Comparative Example 5

On the same imageable layers disclosed in Invention Example 5, another two topcoat formulations were applied, each comprising 4 g of a poly(vinyl alcohol) with hydrolysis level of more than about 85%, 4 g of IPA, 92 g of water, and 0.02 g of Masurf® FS-1520 to provide a dry coating weight of about 0.4 g/m². The two poly(vinyl alcohol) resins used were Elvanol® 5105 and Mowiol 488. Both of the imageable layer and topcoat formulations were applied using a wire-wound rod and then dried for approximately 60 seconds in a Ranar conveyor oven set at 120° C. The resulting imageable elements did not show any fogging after the 40 hour yellow light test but fogged in less than 1 hour of white light exposure as described in the Invention Example 5.

Invention Example 6

An imageable layer formulation was prepared by dissolving or dispersing 1.1 g of Hybridur® 580 dispersion, 3.3 g of Polymer A (10% in MEK/PGME/BLO/water at 5:2:1:1 ratio, acid number of 98 mg KOH/g), 0.5 g of SR399, 0.5 g of NK ester A-DPH, 0.1 g of Phosmer PE, 0.18 g of IB-05, 0.05 g of S0930, 0.3 g of Pigment A, and 0.4 g of FluorN™ 2900 (5% in PGME) in 3.5 g of PGME, 1.2 g of BLO, 5.7 g of MEK, 1 g of methanol, and 0.6 g of water. The imageable layer formulation was applied to an electrochemically grained and sulfuric acid anodized aluminum substrate that had been post-treated with poly(vinyl phosphonic acid) to provide a dry coating weight of about 1.2 g/m².

On the resulting imageable layer, three different topcoat formulations were applied, each comprising 4 g of a poly (vinyl alcohol) with hydrolysis level of less than, or equal to about 85%, 4 g of IPA, 92 g of water, and 0.02 g of Masurf® FS-1520 to provide a dry coating weight of about 0.4 g/m². The three different poly(vinyl alcohol) resins used were Mowiol 385, Mowiol 383, and Mowiol 480. Both the imageable and topcoat formulations were applied using a wire-wound rod and then dried for approximately 60 seconds in a Ranar conveyor oven set at 120° C.

The five tests described in Invention Example 1 were performed on the resulting imageable elements. All of the exposed elements were then developed as described in Invention Example 1. None of the printing plate showed any fogging (no stain on the background) in the 8 hour white light exposure and in 40 hour yellow light exposure. They all required minimum exposure energy of about 20 mJ/cm² to achieve a solid image. All of the printing plates also passed both "DH" and "RH" tests without significant changes in plate developability and speed.

Comparative Example 6

On the same imageable layer disclosed in Invention Example 6, another two topcoat formulations were applied, each comprising 4 g of a poly(vinyl alcohol) with hydrolysis level of more than about 85%, 4 g of IPA, 92 g of water, and 0.02 g of Masurf® FS-1520 to provide a dry coating weight of about 0.4 g/m². The two poly(vinyl alcohol) resins used were Elvanol® 5105 and Mowiol 488. Both of the imageable layer and topcoat formulations were applied using a wire-wound rod and then dried for approximately 60 seconds in a Ranar conveyor oven set at 120° C. The resulting imageable elements did not show any fogging after the 40 hour yellow light test but fogged in less than 1 hour white light exposure as described in the Invention Example 6.

Comparative Example 7

An imageable layer formulation was prepared by dissolving or dispersing 1.1 g of Hybridur® 580 polymer dispersion, 3.3 g of Polymer A (10% in MEK/PGME/BLO/water at 5:2:1:1 ratio, acid number of 98 mg KOH/g), 0.5 g of Sartomer SR399, 0.5 g of NK ester A-DPH, 0.1 g of Phosmer PE, 0.15 g of IB-05, 0.07 g of IRT, 0.3 g of Pigment A and 0.02 g of Zonyl® FSN-100, 1.5 g of BLO, 8 g of MEK, 2 g of methanol, and 0.5 g of water. This formulation was applied to an electrochemically grained and sulfuric acid anodized aluminum substrate that had been post-treated with poly(vinyl phosphonic acid) to provide a dry coating weight of about 1.2 g/m². On the resulting imageable layer, a topcoat formulation comprising 4 g of Elvanol® 5105, 96 g of water, and 0.02 g of Masurf® FS-1520 was applied to provide a dry coating weight of about 0.4 g/m². Both formulations were applied using a wire-wound rod and then dried for approximately 60 seconds in a Ranar conveyor oven set at 120° C.

The resulting imageable element was placed on a CREO Trendsetter® 3244x image setter and exposed using an 830 nm IR laser. The imaged element was then developed at a processing speed of 5 ft/min (1.5 m/min) using a NE34 processor charged with 956 Developer at 23° C. The minimum energy needed to achieve a solid image was about 20 mJ/cm².

A developed printing plate was tested on Miehle sheet-fed press using a wear ink containing 1.5% calcium carbonate and fountain solution containing Varn Litho Etch 142W at 3 oz./gal. (23.4 ml/liter) and PAR alcohol replacement at 3 oz./gal. (23.4 ml/liter). A chemical resistance test was performed at 5,000 impressions by applying UV plate cleaner and Varn-120 plate cleaner, in different areas to the image of the printing plate and resuming the printing without any cleaning after 10-15 minutes. With an exposure of 90 mJ/cm², the image recovered after 10 impressions and did not show any degradation from the plate cleaners. At the end of the workday, the printing plate was cleaned with Aqua-image cleaner/preserver and left mounted on the press until the next morning. Upon start-up, the printing plate performed identically to the previous evening. The same result was achieved after a weekend break also. At the fully wearing condition, the printing plate did not show any solid wear and highlight fading (AM200) after 45,000 impressions. The printing plate passed both 5-day DH and RH tests described above without any reduction in the plate developability and imaging speed. Thus, this printing plate, made on a laboratory scale, seemed to demonstrate that had desirable properties including resistance to fogging in white light.

However, this imageable element was scaled up for manufacturing and retested in the following manner:

The imageable layer formulation described above (28 kg) was prepared to give a 5.85 w/w solution in a solvent mixture of MEK/PGME/BLO/water at 5:2:1:1 weight ratio. This formulation was applied using a slot coater at 2.1 cm³/ft² (22.7 cm³/m²) coating speed to give a dry film coverage of 1.2 g/m² after drying by forced air, hot air oven at 157° C. for 10 seconds, and 104° C. for 10 seconds. The topcoat formulation (28 kg) described above was then prepared to give a 1.77 w/w solution in water/isopropyl alcohol (96:4 weight ratio), and applied to the dried imageable layer using a slot coater at 22.7 cm³/m² coating speed to give a dry film coverage of 0.4 g/m² after drying in a hot air oven at 110° C. for 20 seconds.

The resulting imageable element was imaged on a CREO Trendsetter® 3244x image setter and an 830 nm IR laser. The imaged element was then developed using an NE34 processor containing 956 Developer at a speed of 5 ft/min (1.5 m/min) at 23° C. The minimum exposure energy needed to achieve a solid image was about 20 mJ/cm².

The resulting printing plate passed both 5-day DH and RH tests described above without any reduction in developability and imaging speed. However, when the printing plate was subjected to test a) as described in Invention Example 1, it fogged in less than 15 minutes of white light exposure of 600 lux.

Comparative Example 8

An imageable layer formulation was prepared by dissolving or dispersing 1.1 g of Hybridur® 580 dispersion, 3.3 g of Polymer A (10% in MEK/PGME/BLO/water at 5:2:1:1 ratio, acid number of 98 mg KOH/g), 0.5 g of Sartomer SR399, 0.5 g of NK ester A-DPH, 0.1 g of Phosmer PE, 0.18 g of IBPF, 0.05 g of S0507, 0.3 g of Pigment A, and 0.4 g of FluorN™ 2900 (5% in PGME) in 3.5 g of PGME, 1.2 g of BLO, 5.7 g of MEK, 1 g of methanol, and 0.6 g of water. The imageable layer formulation was applied to an electrochemically grained and sulfuric acid anodized aluminum substrate that had been post-treated with poly(vinyl phosphonic acid) to provide a dry coating weight of about 1.2 g/m². On the resulting imageable layer, a topcoat formulation was applied, comprising 4 g of Mowiol 480, 4 g of IPA, 92 g of water, and 0.02 g of Masurf® FS-1520 to provide a dry coating weight of about 0.4 g/m².

The resulting imageable element was placed on a CREO Trendsetter® 3244x image setter and exposed to an 830 nm IR laser. The imaged element was then developed in a N34 processor charged with 956 Developer (Eastman Kodak Company) at 23° C. This imageable element showed a slow imaging speed and the minimum energy to achieve a solid image was about 100 mJ/cm².

Comparative Example 9

An imageable layer formulation was prepared by dissolving or dispersing 1.1 g of Hybridur® 580 dispersion, 3.3 g of Polymer A (10% in MEK/PGME/BLO/water at 5:2:1:1 ratio, acid number of 98 mg KOH/g), 0.5 g of Sartomer SR399, 0.5 g of NK ester A-DPH, 0.1 g of Phosmer PE, 0.1 g of Triazine A, 0.05 g of S0507, 0.3 g of Pigment A, and 0.4 g of FluorN™ 2900 (5% in PGME) in 3.5 g of PGME, 1.2 g of BLO, 5.7 g of MEK, 1 g of methanol, and 0.6 g of water. The imageable layer formulation was applied to an electrochemically grained and sulfuric acid anodized aluminum substrate that had been post-treated with poly(vinyl phosphonic acid) to provide a dry coating weight of about 1.2 g/m². On the resulting imageable layer, a topcoat formulation was applied, comprising 4 g of Mowiol 480, 4 g of IPA, 92 g of water, and 0.02 g of Masurf® FS-1520 to provide a dry coating weight of about 0.4 g/m².

The resulting imageable element was placed on a CREO Trendsetter® 3244x image setter and exposed to an 830 nm IR laser. The imaged element was then developed in a N34 processor charged with 956 Developer (Eastman Kodak Company) at 23° C. This imageable element showed very slow imaging speed and it did not generate any image with the exposures of between 10 to 100 mJ/cm².

The invention has been described in detail with particular reference to certain preferred embodiments thereof, but it will be understood that variations and modifications can be effected within the spirit and scope of the invention.

The invention claimed is:

1. An imageable element comprising a substrate having thereon an imageable layer comprising:
a free radically polymerizable component,
an initiator composition capable of generating free radicals sufficient to initiate polymerization of free radically polymerizable groups upon exposure to imaging radiation, said initiator composition comprising a diaryliodonium borate,
an infrared radiation absorbing cyanine dye having a methine chain connecting heterocyclic groups wherein the methine chain is at least 7 carbon atoms in length, and
a primary polymeric binder, and
said imageable element further comprising an overcoat disposed over said imageable layer, said overcoat predominantly comprising a poly(vinyl alcohol) that has a hydrolysis level of from about 60 to about 85%.

2. The element of claim 1 wherein said substrate is an aluminum-containing substrate having a hydrophilic surface upon which said imageable layer is disposed.

3. The element of claim 1 wherein said overcoat is present at a dry coverage of from about 0.1 to about 4 g/m².

4. The element of claim 1 wherein said primary polymeric binder is composed of discrete particles distributed throughout said imageable layer comprising from about 10 to about 70 weight % based on the total dry weight of said imageable layer.

5. The element of claim 1 wherein said diaryliodonium borate is represented by the following Structure (IB):

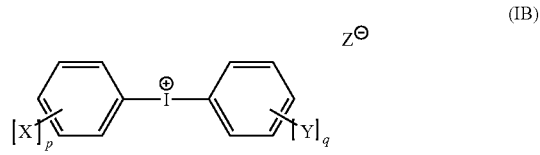

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5, and $Z^\ominus$ is an organic anion represented by the following Structure (IB$_Z$):

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom.

6. The element of claim 5 wherein at least 3 of $R_1$, $R_2$, $R_3$, and $R_4$ are the same or different substituted or unsubstituted aryl groups.

7. The element of claim 5 wherein either p or q is at least 1 and the sum of the carbon atoms in the X and Y substituents or fused ring(s) is at least 6.

8. The element of claim 1 wherein said free radically polymerizable component comprises an ethylenically unsaturated free radically polymerizable monomer or oligomer, or free radically crosslinkable polymer.

9. The element of claim 1 wherein said infrared radiation absorbing cyanine dye comprises said methine chain connecting two N-containing heterocyclic groups comprising at least two fused rings in which at least one nitrogen atom in one of said fused rings is a quaternary nitrogen atom.

10. The element of claim 1 further comprising a secondary polymeric binder in an amount of from about 1.5 to about 40 weight % based on the total dry weight of said imageable layer.

11. The element of claim 1 that is a lithographic printing precursor designed for off-press development.

12. The element of claim 1 wherein said substrate is an electrochemically grained, sulfuric acid anodized, poly(vinyl phosphonic acid) coated lithographic aluminum substrate,
said free radically polymerizable component comprises a free radically polymerizable monomer or oligomer,
said initiator composition comprises a diaryliodonium borate that is present in an amount of from about 0.5 to about 30 weight % based on the total dry weight of said imageable layer and is represented by the following Structure (IB):

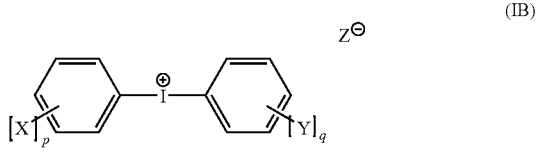

wherein X and Y are independently halo, alkyl, alkoxy, aryl, or cycloalkyl groups, or two or more adjacent X or Y groups can be combined to form a fused carbocyclic or heterocyclic ring with the respective phenyl groups, provided that the sum of the carbon atoms in the X and Y substituents or fused ring(s) is at least 6,
either p or q is at least 1, and $Z^{\ominus}$ is an organic anion represented by the following Structure ($IB_Z$):

wherein $R_1$, $R_2$, $R_3$, and $R_4$ are independently alkyl, aryl, alkenyl, alkynyl, cycloalkyl, or heterocyclyl groups, provided that at least 3 of $R_1$, $R_2$, $R_3$, and $R_4$ are the same or different substituted or unsubstituted aryl groups,
said infrared radiation absorbing cyanine dye is present in an amount of from about 1 to about 30 weight % based on the total dry weight of said imageable layer and is represented by the following Structure (DYE-I):

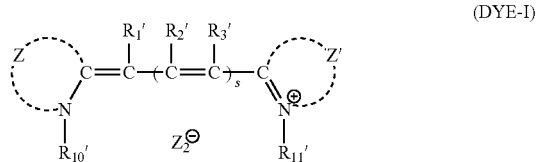

wherein $R_1'$, $R_2'$, and $R_3'$ are independently hydrogen or halo, cyano, alkoxy, acyloxy, aryloxy, carbamoyl, acyl, acylamido, alkylamino, aryl, alkyl, cycloalkyl, arylamino, heteroaryl, thiobenzene, piperazino, morpholino, or thiotetrazole groups, or any two of $R_1'$, $R_2'$, and $R_3'$ can be joined together or with an adjacent heterocyclic ring to complete a 5- to 7-membered carbocyclic or heterocyclic ring, Z and Z' independently represent the carbon, nitrogen, oxygen, or sulfur atoms necessary to form a 5- to 14-membered heterocyclic ring with the illustrated nitrogen and carbon atoms, $R_{10}'$ and $R_{11}'$ are independently alkyl, cycloalkyl, or aryl groups, s is at least 3, and $Z_2^{\ominus}$ is a monovalent anion, and
said primary polymeric binder comprises particles of a poly(urethane-acrylic) hybrid that are present in an amount of from about 10 to about 90 weight % based on the total dry weight of said imageable layer, and and further comprising a secondary polymeric binder that is present in an amount of from about 1.5 to about 70 weight % based on the total dry weight of said imageable layer and comprises one or more polymers comprising recurring units having carboxy groups or derived from one or more (meth)acrylates, (meth)acrylamides, N-substituted (meth)acrylamides, styrene or styrene derivatives, vinyl acetal, N-substituted cyclic imides, maleic anhydride, vinyl carbazole, divinyl monomers, (meth)acrylonitriles, poly(alkylene glycols), or poly(alkylene glycol) (meth)acrylates
said overcoat predominantly comprises one or more poly(vinyl alcohol)s each of which has a hydrolysis level of from about 75 and up to and equal to 85%.

13. The element of claim 1 wherein said infrared radiation absorbing cyanine dye is present in an amount of from about 1 to about 30 weight % based on the total dry weight of said imageable layer and is represented by the following Structure (DYE-II):

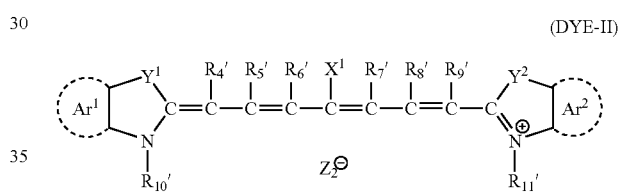

wherein $X^1$ is hydrogen or a halo, —$NPh_2$, or —$X^2$-$L^1$ group, or a group represented by the following Structure ($X_A$):

wherein Ph represents a phenyl group, $X^2$ represents an oxy or thio group, $L^1$ represents a hydrocarbon group having 1 to 12 carbon atoms, heteroaryl group having up to 12 atoms in the ring, or a non-aromatic heterocyclic group having up to 12 atoms in the ring, $R^a$ represents one or more of the same or different alkyl, aryl, amino, or halo substituents, $Z_2^{\ominus}$ is a monovalent anion, $Y^1$ and $Y^2$ represent the same or different sulfur atom or methylene group, $Ar^1$ and $Ar^2$ are the same or different phenyl, naphthyl, or anthryl group, $R_6'$ and $R_7'$ independently represent alkyl, cycloalkyl, or aryl groups having up to 12 carbon atoms, or they may be combined to form a 5- or 6-membered carbocyclic ring, $R_4'$, $R_5'$, $R_8'$, and $R_9'$ are independently hydrogen or alkyl, cycloalkyl, or aryl groups having up to 12 carbon atoms, and $R_{10}'$ and $R_{11}'$ are independently alkyl, cycloalkyl, or aryl groups.

14. A method comprising:
A) imagewise exposing the imageable element of claim 1 using imaging infrared radiation to produce exposed and non-exposed regions, and B) with or without a post-exposure baking step, developing said imagewise exposed element to remove only said non-exposed regions.

15. The method of claim 14 wherein step B is carried out off-press using an aqueous alkaline developer having a pH less than 12.

16. The method of claim 14 wherein said imageable element comprises an electrochemically grained, sulfuric acid anodized, poly(vinyl phosphonic acid) coated lithographic aluminum substrate, having thereon an imageable layer comprising:
a free radically polymerizable component that comprises a free radically polymerizable monomer or oligomer,
an initiator composition that comprises a diaryliodonium borate that is present in an amount of from about 0.5 to about 30 weight % based on the total dry weight of said imageable layer and is represented by the following Structure (IB):

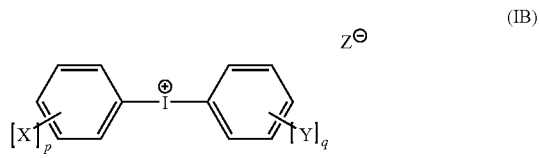

wherein X and Y are independently halo, alkyl, alkoxy, aryl, or cycloalkyl groups, or two or more adjacent X or Y groups can be combined to form a fused carbocyclic or heterocyclic ring with the respective phenyl groups, provided that the sum of the carbon atoms in the X and Y substituents or fused ring(s) is at least 6,
either p or q is at least 1, and $Z^{\ominus}$ is an organic anion represented by the following Structure (IB$_Z$):

wherein $R_1$, $R_2$, $R_3$, and $R_4$ are independently alkyl, aryl, alkenyl, alkynyl, cycloalkyl, or heterocyclyl groups, provided that at least 3 of $R_1$, $R_2$, $R_3$, and $R_4$ are the same or different substituted or unsubstituted aryl groups,
an infrared radiation absorbing cyanine dye that is present in an amount of from about 2 to about 15 weight % based on the total dry weight of said imageable layer and is represented by the following Structure (DYE-I):

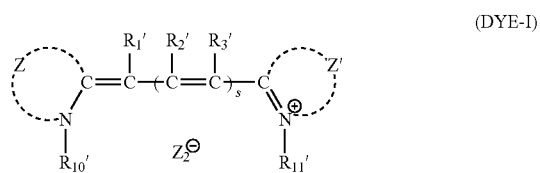

wherein $R_1'$, $R_2'$, and $R_3'$ are independently hydrogen or halo, cyano, alkoxy, acyloxy, aryloxy, carbamoyl, acyl, acylamido, alkylamino, aryl, alkyl, cycloalkyl, arylamino, heteroaryl, thiobenzene, piperazino, morpholino, or thiotetrazole groups, or any two of $R_1'$, $R_2'$, and $R_3'$ can be joined together or with an adjacent heterocyclic ring to complete a 5- to 7-membered carbocyclic or heterocyclic ring, Z and Z' independently represent the carbon, nitrogen, oxygen, or sulfur atoms necessary to form a 5- to 14-membered heterocyclic ring with the illustrated nitrogen and carbon atoms, $R_{10}'$ and $R_{11}'$ are independently alkyl, cycloalkyl, or aryl groups, s is at least 3, and $Z_2^{\ominus}$ is a monovalent anion, and a primary polymeric binder comprising particles of a poly(urethane-acrylic) hybrid that are present in an amount of from about 10 to about 70 weight % based on the total dry weight of said imageable layer, and a secondary polymeric binder present in an amount of from about 1.5 to about 40 weight % based on the total dry weight of said imageable layer and comprising one or more polymers comprising recurring units having carboxy groups or derived from one or more (meth)acrylates, (meth)acrylamides, N-substituted (meth)acrylamides, styrene or styrene derivatives, vinyl acetal, N-substituted cyclic imides, maleic anhydride, vinyl carbazole, divinyl monomers, (meth)acrylonitriles, poly(alkylene glycols), or poly(alkylene glycol) (meth)acrylates, and said overcoat predominantly comprises one or more poly(vinyl alcohol)s each of which has a hydrolysis level of from about 75 and up to and equal to 85%.

17. The method of claim 14 wherein said imaging infrared radiation has a $\lambda_{max}$ of from about 750 to about 1200 nm.

18. An imageable element comprising a substrate having thereon an imageable layer comprising:
a free radically polymerizable component,
an initiator composition capable of generating free radicals sufficient to initiate polymerization of free radically polymerizable groups upon exposure to imaging radiation, said initiator composition comprising a diaryliodonium borate,
an infrared radiation absorbing cyanine dye having a methine chain connecting heterocyclic groups wherein the methine chain is at least 7 carbon atoms in length, and
a primary polymeric binder, and
said imageable element further comprising an overcoat disposed over said imageable layer, said overcoat predominantly comprising a poly(vinyl alcohol) that has a hydrolysis level of from about 75 to about 85%,
wherein the infrared radiation absorbing cyanine dye is any one of the following dyes:

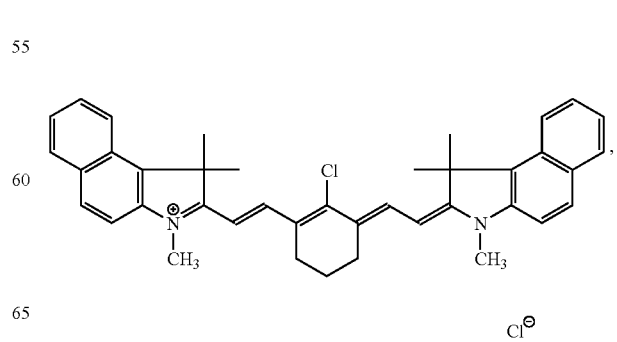

-continued
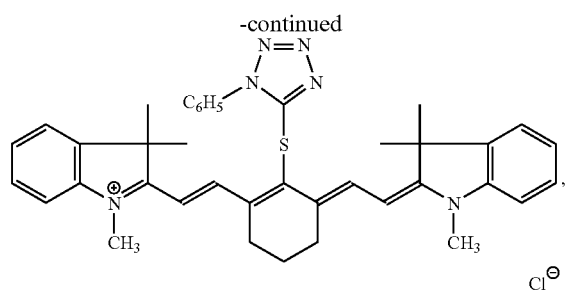
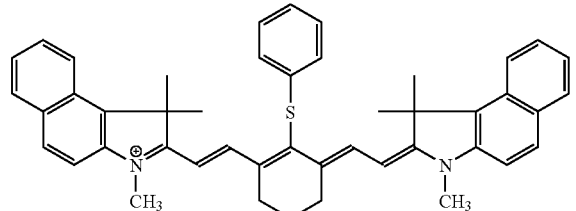
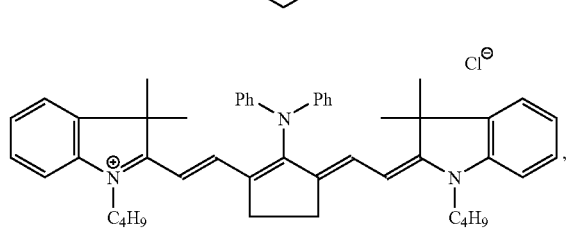
-continued
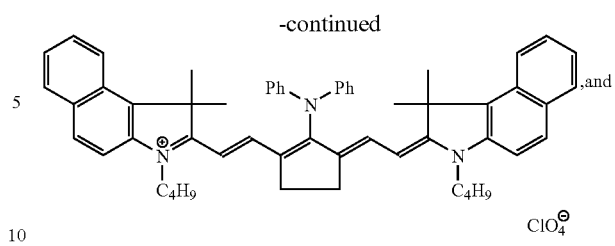
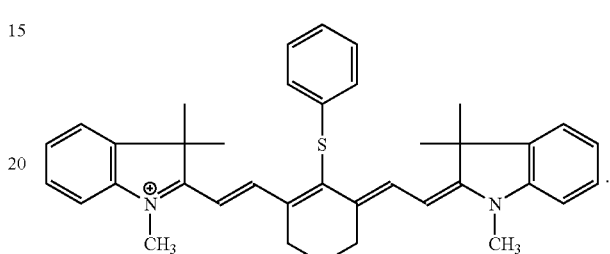
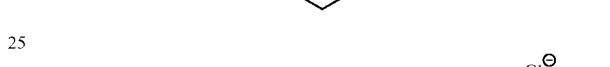
* * * * *